US006235675B1

(12) United States Patent
McIlroy

(10) Patent No.: US 6,235,675 B1
(45) Date of Patent: May 22, 2001

(54) METHODS OF FORMING MATERIALS CONTAINING CARBON AND BORON, METHODS OF FORMING CATALYSTS, FILAMENTS COMPRISING BORON AND CARBON, AND CATALYSTS

(75) Inventor: David N. McIlroy, Moscow, ID (US)

(73) Assignee: Idaho Research Foundation, Inc., Moscow, ID (US)

( * ) Notice: Subject to any disclaimer, the term of this patent is extended or adjusted under 35 U.S.C. 154(b) by 0 days.

(21) Appl. No.: 09/399,865

(22) Filed: Sep. 21, 1999

Related U.S. Application Data

(60) Provisional application No. 60/101,350, filed on Sep. 22, 1998.

(51) Int. Cl.[7] ............................. B01J 27/20; B01J 27/22; C01B 31/36
(52) U.S. Cl. .................... 502/177; 502/174; 502/527.14; 502/527.16; 502/527.24; 501/95.1; 501/87; 423/291; 428/366; 428/367; 428/368; 428/378; 428/392; 428/688; 428/704; 427/255.2; 427/249
(58) Field of Search ................................. 502/174, 177, 502/527.16, 527.14, 527.24; 501/95.1, 87; 423/291; 428/368, 367, 366, 378, 392, 688, 704; 427/255.2, 249

(56) References Cited

U.S. PATENT DOCUMENTS

| | | | |
|---|---|---|---|
| 3,369,920 | * 2/1968 | Boedeau et al. | 427/249.4 |
| 3,846,224 | * 11/1974 | Leclercq et al. | 428/338 |
| 3,867,191 | * 2/1975 | Galasso et al. | 428/389 |
| 4,225,355 | * 9/1980 | Galasso et al. | 501/87 |
| 4,287,259 | * 9/1981 | Riley et al. | 428/408 |
| 4,481,257 | * 11/1984 | Suplinskas et al. | 428/366 |
| 4,702,770 | * 10/1987 | Pyzik et al. | 75/236 |
| 5,429,870 | * 7/1995 | Kmetz et al. | 428/368 |

* cited by examiner

*Primary Examiner*—Elizabeth D. Wood
(74) *Attorney, Agent, or Firm*—Wells, St. John, Roberts, Gregory & Matkin, P.S.

(57) ABSTRACT

In one aspect, the invention includes a method of forming a material containing carbon and boron, comprising: a) providing a substrate within a chemical vapor deposition chamber; b) flowing a carbon and boron precursor into the chamber, the precursor being a compound that comprises both carbon and boron; and c) utilizing the precursor to chemical vapor deposit a material onto the substrate, the material comprising carbon and boron. In another aspect, the invention includes a method of forming a catalyst, comprising: a) providing a substrate within a chemical vapor deposition chamber; b) flowing a carbon and boron precursor into the chamber, the precursor being a compound that comprises both carbon and boron; c) utilizing the precursor to chemical vapor deposit a first material onto the substrate, the first material comprising carbon and boron; and d) coating the first material with a catalytic material. In yet another aspect, the invention includes a material comprising: a) a plurality of individual filaments, the individual filaments comprising boron and carbon; and b) greater than 90% of the individual filaments having a thickness of less than 150 nanometers.

59 Claims, 2 Drawing Sheets

METHODS OF FORMING MATERIALS CONTAINING CARBON AND BORON, METHODS OF FORMING CATALYSTS, FILAMENTS COMPRISING BORON AND CARBON, AND CATALYSTS

RELATED APPLICATION DATA

This patent claims priority to U.S. Provisional Application No. 60/101,350 filed on Sep. 22, 1998.

PATENT RIGHTS STATEMENT

This invention was funded in part by the United States National Science Foundation under NSF Cooperative Agreement No. EPS-9350539, and by the National Aeronautic and Space Administration ISCG program; the United States Government has certain rights in the invention.

TECHNICAL FIELD

The invention pertains to materials containing carbon and boron, and to methods of forming such materials. The carbon and boron materials can be in the form of, for example, filaments. The invention also pertains to methods of utilizing materials comprising carbon and boron in other constructions. For example, the invention pertains to catalysts and methods of forming catalysts.

BACKGROUND OF THE INVENTION

Single crystal boron carbide ($B_4C$) is a high temperature refractory material with a melting temperature in excess of 2,400° C. The crystal structure of boron carbide is rhombohedral and consists of 12-atom icosahedral units located at corners of a rhombohedral unit cell connected by C—B—B or C—B—C chains lined along a cell diagonal (O. Chauvet, D. Emin, L. Forro, T. L. Aselage, and Z. Zuppiroli, Phys. Rev. B 53,14450 (1996)). The equilibrium compound in a B—C system is $B_4C$ (ASM Handbook, Vol. 3, Alloy Phase Diagrams (edited by H. Baker), ASM International, Metals Park, Ohio (1992).) Other compounds within the system are generally regarded as solutions of boron in $B_4C$, or as solid solutions with carbon. Single crystal boron carbide has potential application in thermoelectric power conversion (C. Wood and D. Emin, Phys. Rev. B 29, 4582 (1984); C. Wood, D. Emin, and P. E. Gray, Phys. Rev. B 31, 6811 (1985).) A polaronic transport model has been developed to explain the thermoelectric conversion properties of single crystal boron carbide, where polaron hopping between icosahedra is phonon-assisted, or in other words, thermally activated (O. Chauvet, D. Emin, L. Forro, T. L. Aselage, and L. Zuppiroli, Phys Rev. B 53,14450 (1996); C. Wood and D. Emin, Phys. Rev. B 29,4582 (1984); C. Wood, D. Emin, and P. E. Gray, Phys. Rev. B 31, 6811 (1985); I. A. Howard, C. L. Beckel, and D. Emin, Phys. Rev. B 35, 2929 (1987); I. A. Howard, C. L. Beckel, and D. Emin, Phys. Rev. B 35,9265 (1987).) In light of the potential applications of boron carbide, it would be desirable to develop alternative methods of forming boron carbide crystals.

SUMMARY OF THE INVENTION

In one aspect, the invention includes a method of forming a material containing carbon and boron. A substrate is provided within a chemical vapor deposition chamber. A carbon and boron precursor is flowed into the chamber. The precursor is a compound that comprises both carbon and boron The precursor is utilized to chemical vapor deposit a material onto the substrate. The material comprises carbon and boron.

In another aspect, the invention includes a method of forming a catalyst. A substrate is provided within a chemical vapor deposition chamber. A carbon and boron precursor is flowed into the chamber. The precursor is a compound that comprises both carbon and boron. The precursor is utilized to chemical vapor deposit a first material onto the substrate. The first material comprises carbon and boron, The first material is coated with a catalytic material.

In yet another aspect, the invention encompasses a catalytic material comprising a support structure that includes a plurality of individual filaments. The individual filaments comprise boron and carbon, and greater than 90% of the individual filaments having a thickness of less than 150 nanometers. The catalytic material further comprises a catalytic coating on the individual filaments. In a particular embodiment of the invention the catalytic coating comprises a material that catalyzes oxidation of CO and hydrocarbons.

BRIEF DESCRIPTION OF THE DRAWINGS

Preferred embodiments of the invention are described below with reference to the following accompanying drawings.

FIG. 1 is a schematic, diagrammatic, cross-sectional view of an exemplary plasma enhanced chemical vapor deposition chamber that can be utilized in methods of the present invention.

DETAILED DESCRIPTION OF THE PREFERRED EMBODIMENTS

Figure 2:
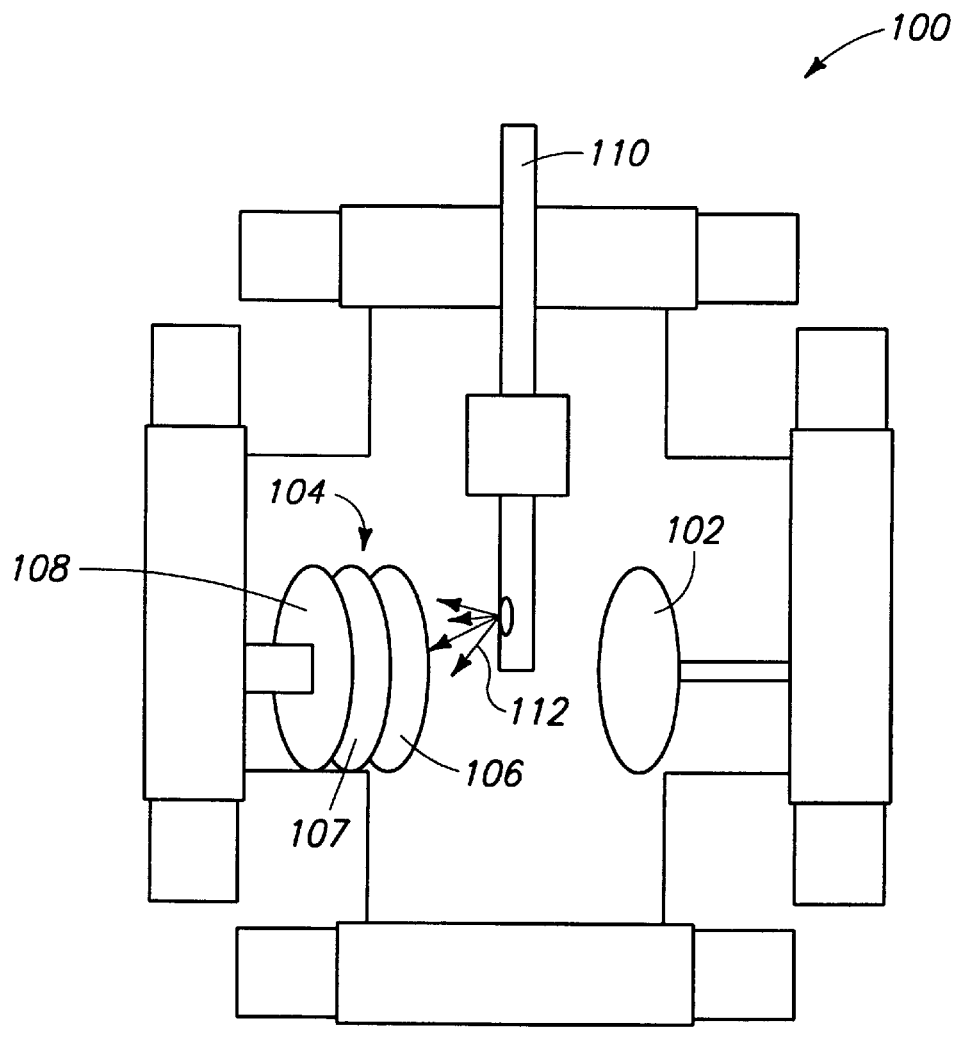
FIG. 2 is a scanning electron microscope image showing boron carbide filaments on a silicon substrate.
Figure 2:
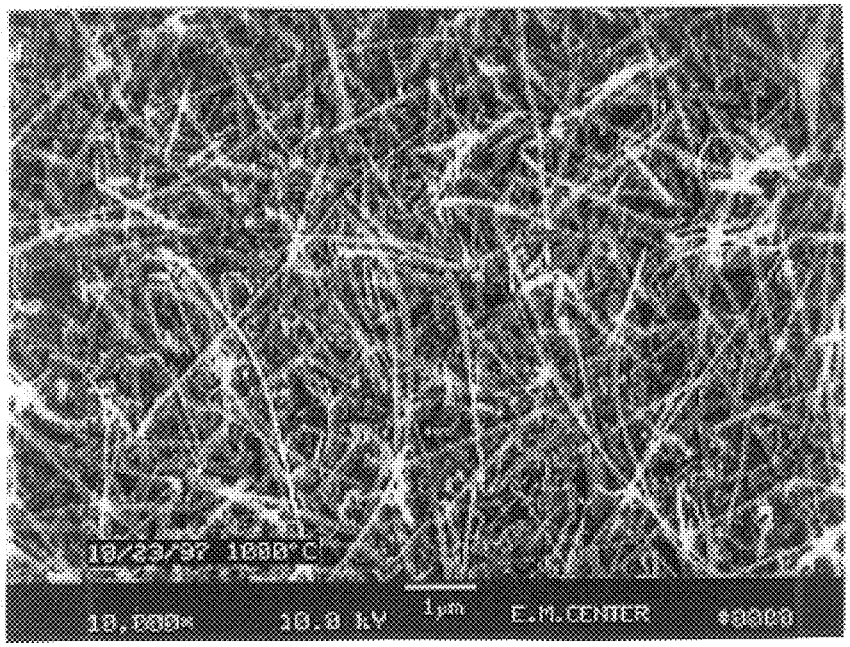

This disclosure of the invention is submitted in furtherance of the constitutional purposes of the U.S. Patent Laws "to promote the progress of science and useful arts" (Article 1, Section 8).

In one aspect, the invention encompasses a method of forming a material containing carbon and boron from a precursor compound that itself comprises both carbon and boron. An exemplary precursor is closo-1,2-dicarbadodecaborane ($C_2B_{10}H_{12}$), which can also be referred to as orthocarborane. The material can be formed by plasma enhanced chemical vapor deposition (PECVD) utilizing a reaction chamber such as the exemplary chamber 100 illustrated in FIG. 1. Chamber 100 comprises a cathode 102, and an anode assembly 104. Anode assembly 104 comprises a heater 108 and a sample holder 107. Holder 107 is configured to receive a substrate 106. Substrate 106 can conmprise, for example, a semiconductor wafer. Chamber 100 further comprises a gas input line 110 through which a gas 112 is flowed into chamber 100. Chamber 100 is preferably connected to a vacuum pump (not shown) to enable control of a pressure within the chamber.

In an exemplary method of the present invention, sample 106 comprises (100)–oriented silicon, and chamber 100 comprises a parallel plate 13.56 MHz chamber. A temperature of substrate 106 is maintained at from about 1,100° C. to about 1,200° C., and a plasma power within chamber 100 is maintained at about 50 watts. Closo-1,2-dicarbadodecaborane is flowed into chamber 100 with argon as a carrier gas. The argon carrier gas is flowed through a source bottle of closo-1,2-dicarbadodecaborane at a temperature of about 50° C. The gas mixture entering chamber 100 comprises 65 mTorr of argon (10 standard cubic centimeters per minute) and 25 mTorr of closo-1,2-dicarbadodecaborane/Ar (3 standard cubic centimeters per minute). In preferred embodiments of the invention, a silicon substrate is cleaned prior to insertion in a PECVD chamber to remove impurities from a surface of the substrate. Such cleaning can comprise, for example, exposing a surface of the substrate to a 5% hydrofluoric acid/deionized water solution for five minutes, followed by rinsing the surface with deionized water (wherein deionized water refers to water having a resistivity of 800,000 ohms-cm).

A seed material is provided within chamber 100 during deposition of the material comprising boron and carbon. The seed material can provide a locus for growth of boron carbide filaments. Specifically, the seed material can react with boron, from a vapor in chamber 100, to form a eutectic liquid phase. This phase will have a liquid-solid interace with substrate 106 and a liquid-vapor interface with the vapors present in chamber, 100. Materials from the vapor phase in chamber 100 can pass through the liquid-vapor interface to saturate the liquid with boron and carbon (probably with concomitant loss of hydrogen). Crystal growth can then occur by precipitation from the supersaturated liquid at the solid liquid interface. This proposed mechanism of crystal growth is provided to possibly assist persons of ordinary skill in the art in understanding methods of the present invention. The invention is not to be limited to any particular mechanism except to the extent that such is specifically claimed in the claims that follow.

Exemplary seed materials include elemental nickel, platinum and iron, with elemental iron being a preferred seed material. The seed material is preferably provided within chamber 100 to a concentration of greater than 0 and less than about 10 parts per million (ppm), and more preferably is provided to a concentration of greater than 0 and less than about 1 ppm.

A carbon and boron material deposited utilizing the above-described process is shown in FIG. 2. Specifically, FIG. 2 illustrates a scanning electron micrograph obtained from an Amray 1820 scanning electron microscope operated at 10 kV. The material shown in FIG. 2 comprises a plurality of filaments. To the naked eye, the material of FIG. 2 appears to be a dulled grayish-black mat. Such mat is typically formed to a thickness of about 1 micrometer after a deposition time of about two hours.

The individual filaments of the FIG. 2 structure have been found to comprise $B_4C$. The filaments are long and shin, with individual filaments having diameters of less than about 150 nanometers, and lengths of 13 micrometers or greater. Under preferred conditions, individual filaments have diameters of from 18 to 150 nanometers, and under even more preferred conditions, have diameters of from about 15 nanometers to about 30 nanometers, while comprising the lengths of greater than or equal to about 13 micrometers. The distribution of filament thicknesses within the material of FIG. 2 can be relatively tightly controlled by methods of the present invention. Specifically, it is found that greater than 90% of the filaments within the material will have thicknesses of less than 150 nanometers, more preferably that greater than 90% of the filaments will have thicknesses of from 18 nanometers to about 150 nanometers, and even more preferably that greater than 90% of the individual filaments will have thicknesses in a range of from about 15 nanometers to about 30 nanometers. The above-discussed relative thicknesses of individual filaments correspond to aspect ratios ranging from about 90 to about 720 for the material of FIG. 2. The individual filaments can be referred to as nanowires, indicating that the filaments are in the shape of wires having thicknesses on a nanometer scale.

Figure 3:
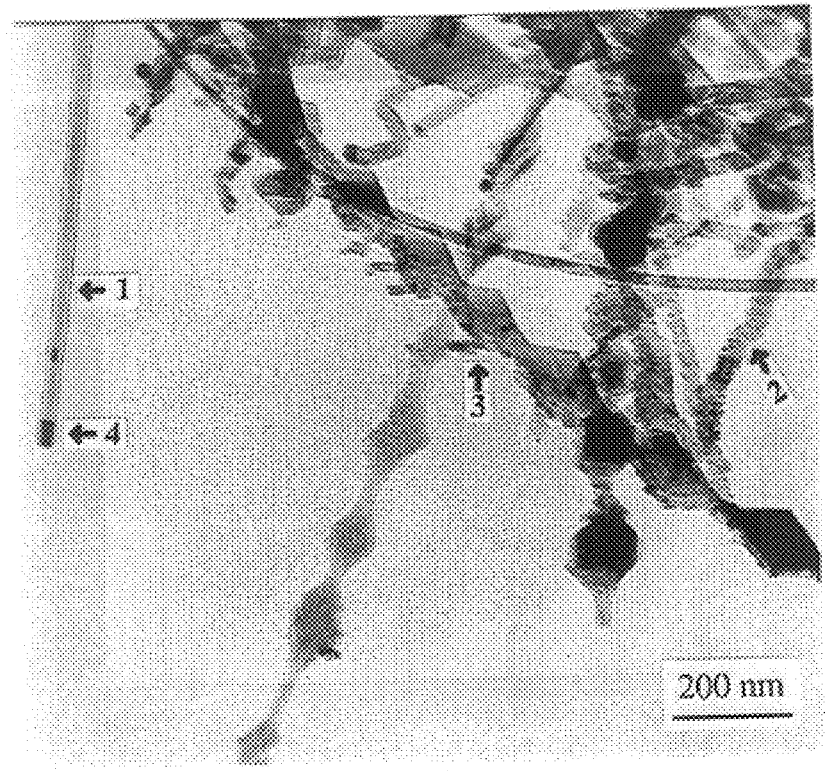
FIG. 3 is a bright field TEM image showing different boron carbide filament morphologies: (area 1) cylindrical shapes with smoothly curved side surfaces; (area 2) cylindrical shapes with faceted side surfaces; (area 3) linear arrays of one or more cylinders terminating at one or more rhomboidal nodes.

FIG. 3 illustrates a bright field transmission electron micrograph obtained utilizing a Philips CM200 analytical transmission electron microscope (TEM) operated at 200 kV. The micrograph shows three distinct forms of nanowires. Such distinct forms comprise (1) filaments comprising a cylindrical shape having smoothly curved side surfaces, such as the filament illustrated by the label 1 in the micrograph of FIG. 3; (2) filaments having a cylindrical shape with faceted side surfaces, such as the filament !labeled 2 in the micrograph of FIG. 3; and (3) filaments comprising linear arrays of one or more cylinders terminating at one or more rhomboidal nodes, such as is shown by the filament labeled 3 in the micrograph of FIG. 3. The rhomboidal nodes of the third distinct form of nanowire appear to be generally equally spaced along the linear array of cylinders and nodes.

It is noted that the cylindrical filaments having smooth surfaces typically have an average diameter of about 20 nanometers, whereas the cylindrical filaments having faceted side surfaces typically have an average diameter of 50 nanometers. More specifically, the filaments having cylindrical shapes with smoothly curved side surfaces typically have cross-sectional diameters of from about 15 nanometers to about 30 nanometers, while the filaments having cylindrical shapes with faceted side surfaces typically have cross-sectional widths of from about 25 nanometers to about 75 nanometers.

A selected-area diffraction (SAD) of filaments such as those shown in FIG. 3 indicates that such filaments are monocrystalline with a rhombohedral crystal structure. Further, energy dispersive spectroscopy (EDS) measurements indicate that the filaments comprise a B:C ratio of about 4:1, which suggests that the filaments comprise $B_4C$.

The filaments shown in FIG. 3 terminate with a dark tip, such as the tip labeled 4. Energy dispersive spectra obtained from the tips indicates that such tips comprise iron. Iron is not detected in other portions of the filaments. Further analysis of the tips indicates that the iron is in the form of tetragonal $Fe_3B$. The presence of iron selectively located at the tips of the filaments supports a theory that the filaments grow by a vapor-liquid-solid mechanism with a seed material (iron) providing a locus from which the growth initiates.

Such mechanism can be utilized to control locations of nanowire growth. Specifically, filaments can be selectively grown at particular locations of a substrate by providing seed materials at such particular locations and then subjecting the substrate to a PECVD process.

The morphology of the rough-walled filaments shown in FIG. 3 (i.e. the cylindrical filaments with faceted side surfaces) indicates that they may be smooth-walled filaments (i.e. cylindrical shaped filaments having smoothly curved side surfaces) upon which small (on the order of 9 nanometers to 20 nanometers) boron carbide crystals have adhered. A mechanism by which the boron carbide crystals could adhere to the smooth-walled filaments is that the smooth-walled filaments could grow first and then act as nucleation sites for subsequent crystal growth. Such secondary nucleation could occur when supersaturation of growth elements occurs in a vapor within chamber 100 (FIG. 1).

The filaments comprising linear arrays of one or more cylinders terminating at one or more rhomboidal nodes effectively show a periodic instability in their diameter. The rhomboidal nodes reflect the crystal structure of the $B_4C$ phase. A mechanism which could account for these structures is that a contact angle of a liquid droplet during formation of the structures is dependent on a roughness of an interface. The roughness of the interface can in turn depend on the supersaturation, and hence, curvature of a liquid droplet. It may be possible to avoid, or alternatively enhance, formation of these structures by adding an impurity during deposition of the filaments which changes a contact angle. Such impurity could, for example, be in the form of a metal ion, such as iron. Also, it is noted that it may be possible to selectively grow only one of the three filament structures shown in FIG. 3 by, for example, adjusting a concentration of seed material in a deposition chamber, or by carefully controlling flow rates of precursor gases into the deposition chamber.

The boron and carbon comprising filaments formed by methods of the present invention can have a number of industrial applications. One such application is to utilize the filaments for ceramic matrix composites (CMC). The filaments can be utilized as a skeletal structure for such composites, with other materials of the composite being flowed around the filaments and solidified. CMCs are described generally in R. R. Wills, R. A. Mankle, and S. P Mukheijee, Amer. Ceram. Soc. Bull 62, 904 (1983).

Another use of the filaments of the present invention is as a support structure for retaining a catalytic material. For instance, the filaments could be coated with a catalytic material by chemical vapor deposition of such catalytic material onto the filaments. An exemplary catalytic material is platinum. Platinum can be chemical vapor deposited on the filaments utilizing a precursor comprising dimethyl (1,5 cyclooctadiene) platinum. In an exemplary process, the platinum is deposited within a plasma enhanced chemical vapor deposition reaction chamber having 150 mTorr of argon; 100 mTorr of argon/dimethyl (1,5 cyclooctadiene) platinum, and a substrate temperature of about 300° C., in a time of about 1 hour. Platinum coated filaments can be utilized for, for example, catalyzing oxidation of carbon monoxide (CO) and hydrocarbons. For instance, platinum-coated filaments can be incorporated into a catalytic converter of an automobile exhaust system to catalyze oxidation of carbon monoxide and hydrocarbons in the automobile exhaust.

Other uses for boron carbide filaments of the present invention can utilize the thermopower properties of the filaments. Thermopower refers to the generation of electricity from a temperature gradient in a material, and can result from stimulation of phonon modes within the material. The thin filaments of the present invention can enable more power to be selectively obtained from the same temperature gradient than can be obtained from thicker boron carbide materials, as the thinner materials of the present invention can enable selective generation of particular phonon modes.

Another way of describing a difference between the filaments of the present invention and large boron carbide fibers of the prior art is that the filaments of the present invention can be limited by quantum mechanical effects to only comprise a few phonon modes, and the larger filaments are not so limited. Such limitation of the particular phonon modes comprised by filaments of the present invention can enable such filaments to be utilized for achieving better control of phonon-assisted processes than can be achieved with the larger boron carbide structures of the prior art.

It is noted that in the linear array structures of FIG. 3 (labeled as 3), the rhomboidal nodes can function as quantum dots and the cylindrical wires can function as quantum wires. The quantum wires will have different electronic energy levels available than will the quantum dots. Accordingly, the quantum dots can effectively modify electronic transport between the quantum wires on opposing surfaces of the dots.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a material containing carbon and boron, comprising:
   providing a substrate within a chemical vapor deposition chamber;
   flowing a carbon and boron precursor into the chamber, the precursor being a compound that comprises both carbon and boron; and
   utilizing the precursor to chemical vapor deposit a material onto the substrate, the material comprising carbon and boron.

2. The method of claim 1 wherein the utilizing comprises subjecting the precursor to plasma enhanced chemical vapor deposition conditions.

3. The method of claim 1 wherein the chemical vapor deposited material comprises $B_4C$.

4. The method of claim 1 further comprising providing a seed material within the chemical vapor deposition chamber prior to the utilizing.

5. The method of claim 4 wherein the seed material comprises one or more of Fe, Ni and Pt.

6. The method of claim 4 wherein the seed material comprises Fe and is provided to a concentration of greater than 0 and less than about 10 ppm.

7. The method of claim 4 wherein the seed material comprises Fe and is provided to a concentration of greater than 0 and less than about 1 ppm.

8. The method of claim 1 wherein the precursor comprises closo-1,2-dicarbadodecaborane.

9. The method of claim 1 wherein the precursor consists essentially of closo-1,2-dicarbadodecaborane.

10. The method of claim 1 wherein the chemical vapor deposited material comprises a plurality of filaments.

11. The method of claim 1 wherein the chemical vapor deposited material comprises a plurality of filaments, and wherein greater than 90% of the deposited filaments have a thickness of less than 150 nanometers.

12. The method of claim 1 wherein the chemical vapor deposited material comprises a plurality of filaments, and wherein greater than 90% of the deposited filaments have a thickness of less than 150 nanometers and lengths of at least 13 micrometers.

13. The method of claim 1 wherein the chemical vapor deposited material comprises a plurality of filaments, and wherein greater than 90% of the deposited filaments have a thickness of from about 15 nanometers to about 150 nanometers.

14. The method of claim 1 wherein the chemical vapor deposited material comprises a plurality of filaments, and wherein greater than 90% of the deposited filaments have a thickness of from about 15 nanometers to about 150 nanometers and lengths of at least 13 micrometers.

15. The method of claim 1 wherein the chemical vapor deposited material comprises a plurality of filaments, and wherein greater than 90% of the deposited filaments have a thickness of from about 15 nanometers to about 30 nanometers.

16. The method of claim 1 wherein the chemical vapor deposited material comprises a plurality of filaments, and wherein greater than 90% of the deposited filaments have a thickness of from about 15 nanometers to about 30 nanometers and lengths of at least 13 micrometers.

17. The method of claim 1 wherein the substrate comprises monocrystalline silicon.

18. A method of forming a material containing carbon and boron, comprising:
    providing a substrate within a chemical vapor deposition chamber;
    flowing carbon and boron precursors into the chamber, the carbon and boron precursors comprising one or more compounds that comprise both carbon and boron; and
    subjecting the precursors to plasma-enhanced chemical vapor deposition to deposit a material onto the substrate, the material comprising carbon and boron.

19. The method of claim 18 wherein the carbon and boron precursors comprise closo-1,2-dicarbadodecaborane.

20. The method of claim 18 wherein the carbon and boron precursors consist essentially of closo-1,2-dicarbadodecaborane.

21. The method of claim 18 wherein the material is deposited as a plurality of filaments.

22. The method of claim 18 wherein the material is deposited as a plurality of filaments, and wherein greater than 90% of the deposited filaments have a thickness of less than 150 nanometers.

23. The method of claim 18 wherein the material is deposited as a plurality of filaments, and wherein greater than 90% of the deposited filaments have a thickness of less than 150 nanometers and lengths of at least 13 micrometers.

24. The method of claim 18 wherein the material is deposited as a plurality of filaments, and wherein greater than 90% of the deposited filaments have a thickness of from about 15 nanometers to about 150 nanometers.

25. The method of claim 18 wherein the material is deposited as a plurality of filaments, and wherein greater than 90% of the deposited filaments have a thickness of from about 15 nanometers to about 150 nanometers and lengths of at least 13 micrometers.

26. The method of claim 18 wherein the material is deposited as a plurality of filaments, and wherein greater than 90% of the deposited filaments have a thickness of from about 15 nanometers to about 30 nanometers.

27. The method of claim 18 wherein the material is deposited as a plurality of filaments, and wherein greater than 90% of the deposited filaments have a thickness of from about 15 nanometers to about 30 nanometers and lengths of at least 13 micrometers.

28. The method of claim 18 wherein the substrate comprises monocrystalline silicon.

29. A method of forming a catalyst, comprising:
    providing a substrate within a chemical vapor deposition chamber;
    flowing a carbon and boron precursor into the chamber, the precursor being a compound that comprises both carbon and boron;
    utilizing the precursor to chemical vapor deposit a first material onto the substrate, the first material comprising carbon and boron; and
    coating the first material with a catalytic material.

30. The method of claim 29 wherein the catalytic material comprises platinum.

31. The method of claim 29 wherein the catalytic material comprises platinum and wherein the coating comprises:
    flowing dimethyl (1,5 cyclooctadiene) platinum into the chamber; and
    subjecting the dimethyl (1,5 cyclooctadiene) platinum to plasma enhanced chemical vapor deposition conditions.

32. A method of forming a catalyst, comprising:
    providing a substrate within a chemical vapor deposition chamber;
    flowing carbon and boron precursors into the chamber;
    subjecting the precursors to plasma-enhanced chemical vapor deposition to deposit a first material onto the substrate, the first material comprising carbon and boron; and
    coating the first material with a catalytic material.

33. The method of claim 32 wherein the catalytic material comprises platinum.

34. The method of claim 32 wherein the catalytic material comprises platinum and wherein the coating comprises:
    flowing dimethyl (1,5 cyclooctadiene) platinum into the chamber; and
    subjecting the dimethyl (1,5 cyclooctadiene) platinum to plasma enhanced chemical vapor deposition conditions.

35. A filament comprising:
    a thickness of less than 150 nanometers; and
    boron and carbon essentially throughout the thickness.

36. The filament of claim 35 wherein the boron and carbon are in the form of $B_4C$.

37. The filament of claim 35 comprising a cylindrical shape having smoothly curved side surfaces.

38. The filament of claim 35 comprising a cylindrical shape having smoothly curved side surfaces, the cylinder having a cross-sectional diameter of from about 15 nanometers to about 30 nanometers.

39. The filament of claim 35 comprising a cylindrical shape having faceted side surfaces.

40. The filament of claim 35 comprising a cylindrical shape having faceted side surfaces, the cylinder having a cross-sectional width of from about 25 nanometers to about 75 nanometers.

41. The filament of claim 35 being shaped as a linear array of one or more cylinders terminating at one or more rhomboidal nodes.

42. The filament of claim 35 comprising a length of at least 13 micrometers.

43. The filament of claim 35 having a thickness of from 18 nanometers to 150 nanometers.

44. The filament of claim 35 having a thickness of from 15 nanometers to 30 nanometers.

45. A material comprising:
    a plurality of individual filaments,
    greater than 90% of the individual filaments having a thickness of less than 150 nanometers; the individual filaments comprising boron and carbon throughout substantially all of the thickness.

46. The material of claim 45 wherein greater than 90% of the filaments have lengths of at least 13 micrometers.

47. The material of claim 45 having an aspect ratio of from about 90 to about 720.

48. The material of claim 45 wherein greater than 90% of the filaments have thicknesses of from about 15 nanometers to about 150 nanometers.

49. The material of claim 45 wherein greater than 90% of the filaments have thicknesses of from about 15 nanometers to about 150 nanometers and lengths of at least 13 micrometers.

50. The material of claim 45 wherein greater than 90% of the filaments have thicknesses of from about 15 nanometers to about 30 nanometers.

51. The material of claim 45 wherein greater than 90% of the filaments have thicknesses of from about 15 nanometers to about 30 nanometers and lengths of at least 13 micrometers.

52. A catalytic material comprising:
 a support structure comprising a plurality of individual filaments, the individual filaments comprising boron and carbon, greater than 90% of the individual filaments having a thickness of less than 150 nanometers; and
 a catalytic coating on the individual filaments, the catalytic coating comprising a material that catalyzes oxidation of CO and hydrocarbons.

53. The material of claim 52 wherein the catalytic material comprises platinum.

54. The material of claim 52 wherein greater than 90% of the filaments have lengths of at least 13 micrometers.

55. The material of claim 52 having an aspect ratio of from about 90 to about 720.

56. The material of claim 52 wherein greater than 90% of the filaments have thicknesses of from about 15 nanometers to about 150 nanometers.

57. The material of claim 52 wherein greater than 90% of the filaments have thicknesses of from about 15 nanometers to about 150 nanometers and lengths of at least 13 micrometers.

58. The material of claim 52 wherein greater than 90% of the filaments have thicknesses of from about 15 nanometers to about 30 nanometers.

59. The material of claim 52 wherein greater than 90% of the filaments have thicknesses of from about 15 nanometers to about 30 nanometers and lengths of at least 13 micrometers.

* * * * *

UNITED STATES PATENT AND TRADEMARK OFFICE
CERTIFICATE OF CORRECTION

PATENT NO. : 6,235,675 B1
DATED : May 22, 2001
INVENTOR(S) : David N. McIlroy

It is certified that error appears in the above-identified patent and that said Letters Patent is hereby corrected as shown below:

Column 3,
Line 50, replace "shin" with -- thin --.

Column 4,
Line 14, replace "!labeled" with -- labeled --.

Signed and Sealed this

Thirtieth Day of October, 2001

Attest:

*Attesting Officer*

NICHOLAS P. GODICI
*Acting Director of the United States Patent and Trademark Office*